(12) United States Patent
Reich et al.

(10) Patent No.: US 7,501,634 B1
(45) Date of Patent: Mar. 10, 2009

(54) METHOD AND SYSTEM FOR DISTRIBUTION OF AN EXPOSURE CONTROL SIGNAL FOR FOCAL PLANE ARRAYS

(75) Inventors: Robert K. Reich, Tyngsborough, MA (US); Bernard Kosicji, Acton, MA (US); Dennis Rathman, Ashland, MA (US); Richard Osgood, Winchester, MA (US); Michael Rose, Watertown, MA (US); R. Allen Murphy, Boxborough, MA (US); Robert Berger, Lexington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 1141 days.

(21) Appl. No.: 10/742,285

(22) Filed: Dec. 19, 2003

(51) Int. Cl.
  *H01L 27/146* (2006.01)
(52) U.S. Cl. .................................. 250/370.09
(58) Field of Classification Search ............. 250/370.09
  See application file for complete search history.

(56) References Cited

U.S. PATENT DOCUMENTS

| 5,018,177 | A  | * | 5/1991 | McDavid et al. ............ 378/62 |
| 6,272,207 | B1 |   | 8/2001 | Tang |
| 6,868,138 | B2 | * | 3/2005 | Clinthorne et al. ......... 378/98.8 |
| 2008/0128698 | A1 | * | 6/2008 | Martin et al. ............... 257/55 |

OTHER PUBLICATIONS

"High-Speed, Electronically Shuttered Solid-State Imager Technology," Reich et al. *MIT Lincoln Laboratory.* Jul. 8, 2002.

* cited by examiner

*Primary Examiner*—David P Porta
*Assistant Examiner*—Marcus H Taningco
(74) *Attorney, Agent, or Firm*—Gauthier & Connors LLP

(57) ABSTRACT

A large format imager includes an array of pixels for converting electromagnetic radiation into electrical signals and a trigger to from an optical pulse so as to trigger the pixels to generate an integration period. Each pixel includes a photodiode to convert light intensity of high-frequency radiation into an electrical charge, a reset switch to reset the photodiode, circuitry to enable sampling of the electrical charge produced by the photodiode, a photoswitch to convert an optical trigger pulse, received from the trigger, into an electrical signal, an inverter to produce a control signal corresponding to the electrical signal produced by the photoswitch, and control circuitry to locally generate integration control signals. The integration control signals control a start of an integration period for the photodiode, duration of the integration period for the photodiode, and the sampling of the electrical charge produced by the photodiode. The large format imager may also include a trigger for producing an electrical pulse so as to trigger the pixels to generate an integration period and tree type electrical distribution system for propagating the electrical pulse to all the pixels, wherein each pixel includes a global repeater circuit to propagate a first edge of said electrical pulse along said tree type electrical distribution system and a local repeater circuit to provide a local array of pixels with the first edge of the electrical pulse.

22 Claims, 7 Drawing Sheets

METHOD AND SYSTEM FOR DISTRIBUTION OF AN EXPOSURE CONTROL SIGNAL FOR FOCAL PLANE ARRAYS

GOVERNMENT RIGHTS NOTICE

The present invention was made with government support under Grant (Contract) Number, F19628-00-C-0002, awarded by Department of the Air Force. The Government has certain rights to this invention.

FIELD OF THE PRESENT INVENTION

The present invention is directed to the distribution of high-speed exposure control for large format imagers for capturing single or multiple image frames. More particularly, the present invention utilizes an electrical and/or optical distribution of high-speed exposure control for large format imagers to provide low timing skew and low jitter integration control.

BACKGROUND OF THE PRESENT INVENTION

Sensitive imaging with large-format solid-state devices at high frame rates (~1 million frames per second) is a difficult task. More specifically, a large-format solid-state imager with exposure times below a nanosecond do not exist. High-speed imaging is done either with film or specially adapted tube-based technology (streak cameras, intensified tubes, modified microchannel plates, etc.). These approaches typically suffer from low dynamic range, low contrast, high noise, and inflexible operation.

While conventional imager technology is appropriate for sub-microsecond integration times, the conventional pixel architecture makes it challenging to extend this technology to shutter times below a few nanoseconds. Moreover, for high-speed, large-format detectors with millions of pixels, the exposure control must be distributed to all pixels such that the sampling occurs effectively simultaneously. For detectors with dimensions of multiple centimeters, the time to propagate across a chip is hundreds of picoseconds. Thus, the control signal distribution system of conventional imager technology fails to provide an architecture to realize such fast shutter times.

Therefore it is desirable to provide a pixel architecture that is capable of shutter times below a few nanoseconds. Moreover, it is desirable to develop imager technology to provide x-ray imaging detectors with very high-speed sampling performance (100 picoseconds to 1 nanoseconds) for such applications as plasma diagnostics and high-speed radiographic imaging. Lastly, it is desirable to provide fast-sampling, large-format focal-plane arrays, which enable distribution of the signals that control the start and length of an integration period in a manner to realize shutter times below a few nanoseconds.

SUMMARY OF THE PRESENT INVENTION

A first aspect of the present invention is a large format imager. The large format imager includes an array of pixels for converting electromagnetic radiation into electrical signals and trigger means for accepting an optical pulse so as to trigger the pixels to generate an integration period. Each pixel includes a photodiode to convert electromagnetic radiation into an electrical charge; a reset circuit to reset the photodiode; a select circuit to enable sampling of the electrical charge produced by the photodiode; a photoswitch to convert an optical trigger pulse, received from the trigger means, into an electrical signal; an inverter, operatively connected to the photoswitch, to produce a control signal corresponding to the electrical signal produced by the photoswitch; and control circuitry, in response to the control signal, to locally generate integration control signals, the integration control signals controlling a start of an integration period for the photodiode, a duration of the integration period for the photodiode, and the sampling of the electrical charge produced by the photodiode.

A second aspect of the present invention is a large format imager. The large format imager includes an array of pixels for converting light intensity into electrical signals; trigger means for accepting an optical pulse so as to trigger the pixels to generate an integration period; a plurality of photoswitches, each photoswitch being operatively associated with a subset of the plurality of pixels; and an electrical signal distribution tree associated with each photoswitch and operatively connected to the subset of the plurality of pixels associated with the photoswitch. The photoswitches, upon being illuminated by the trigger means, produce an electrical exposure control signal that is propagated through the electrical signal distribution tree to each of the pixels in the subset of the plurality of pixels. Each pixel includes a photodiode to convert electromagnetic radiation into an electrical charge, reset circuitry to reset the photodiode, a select circuitry to enable sampling of the electrical charge produced by the photodiode, and control circuitry, in response to the electrical exposure control signal, to locally generate integration control signals, the integration control signals controlling a start of an integration period for the photodiode, a duration of the integration period for the photodiode, and the sampling of the electrical charge produced by the photodiode.

A third aspect of the present invention is a pixel site. The pixel site includes a photodiode to convert electromagnetic radiation into an electrical charge; reset circuitry to reset the photodiode; select circuitry to enable sampling of the electrical charge produced by the photodiode; a photoswitch to convert an optical trigger pulse into an electrical signal; an inverter, operatively connected to the photoswitch, to produce a control signal corresponding to the electrical signal produced by the photoswitch; and control circuitry, in response to the control signal, to locally generate integration control signals, the integration control signals controlling a start of an integration period for the photodiode, a duration of the integration period for the photodiode, and the sampling of the electrical charge produced by the photodiode.

A fourth aspect of the present invention is a pixel region. The pixel region includes a plurality of pixels; a photoswitch being operatively associated with the plurality of pixels; and an electrical signal distribution tree operatively connected to the plurality of pixels and the photoswitch. The photoswitch, upon being illuminated, produces an electrical exposure control signal that is propagated through the electrical signal distribution tree to each of the plurality of pixels. Each pixel includes a photodiode to convert light intensity of high-frequency radiation into an electrical charge, reset circuitry to reset the photodiode, select circuitry to enable sampling of the electrical charge produced by the photodiode, and control circuitry, in response to the electrical exposure control signal, to locally generate integration control signals, the integration control signals controlling a start of an integration period for the photodiode, a duration of the integration period for the photodiode, and the sampling of the electrical charge produced by the photodiode.

A fifth aspect of the present invention is a large format imager. The large format imager includes a plurality of pixels for converting electromagnetic radiation into electrical signals; trigger means for producing an electrical pulse so as to trigger the pixels to generate an integration period; and a tree type electrical distribution system for propagating the electrical pulse to all the pixels. Each pixel includes a photodiode to convert light intensity of high-frequency radiation into an electrical charge, a global repeater circuit to propagate a first edge of the electrical pulse along the tree type electrical distribution system, a local repeater circuit to provide a local array of pixels located at an termination point of said tree type electrical distribution system with said first edge, operatively connected to the local repeater circuit and responsive to the first edge of the electrical pulse, to locally generate integration control signals, the integration control signals controlling a start of an integration period for the photodiode, a duration of the integration period for the photodiode, and the sampling of the electrical charge produced by the photodiode.

A sixth aspect of the present invention is a large format imager. The large format imager includes a plurality of pixels for converting electromagnetic radiation into electrical signals; trigger means for producing an electrical pulse so as to trigger the pixels to generate an integration period; and a tree type electrical distribution system for propagating the electrical pulse to all the pixels. A pixel includes a photodiode to convert electromagnetic radiation into an electrical charge and additional transistors capable of being wired to perform desired functions.

Another aspect of the present invention is a photoswitch. The photoswitch is formed in a CMOS silicon on insulator layer such that the photoswitch is substantially insensitive to radiation having energies above 1 keV and is substantially sensitive to radiation having a short absorption length.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
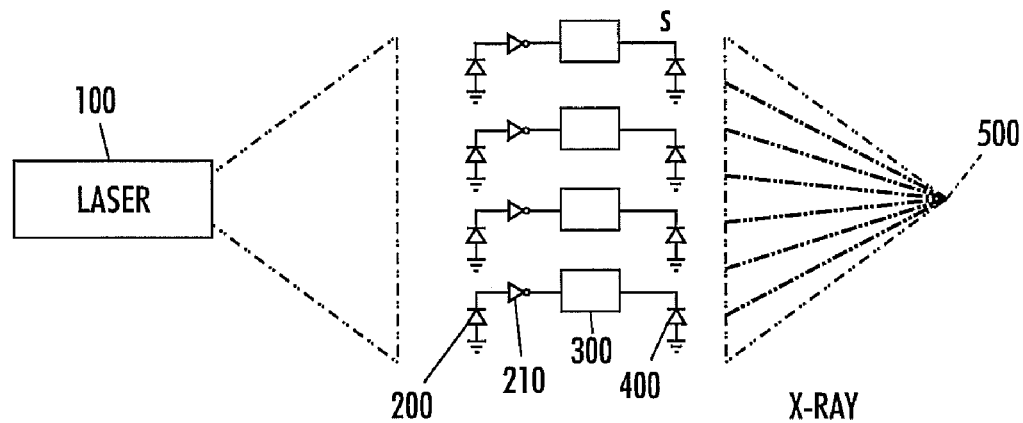
FIG. 1 illustrates a conceptual representation of an optical distribution system for a large-format focal-plane array according to the concepts of the present invention.

The present invention will be described in connection with specific embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

As noted above, for high-speed, large-format detectors with millions of pixels, the exposure control must be distributed to all pixels such that the sampling occurs effectively simultaneously. For detectors with dimensions of multiple centimeters, the time to propagate across a chip is hundreds of picoseconds. Therefore, the present invention provides a parallel clock distribution either electrically and/or optically to reduce the skew.

Figure 2:
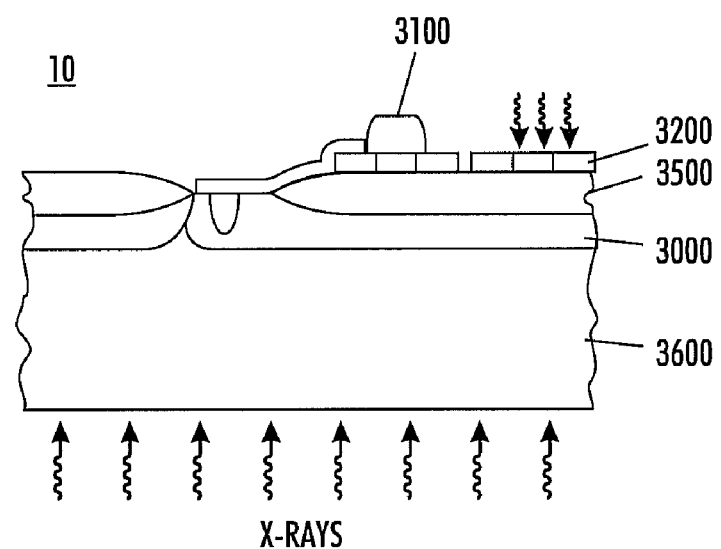
FIG. 2 illustrates a graphical implementation of the optical distribution system illustrated in FIG. 1.
Figure 3:
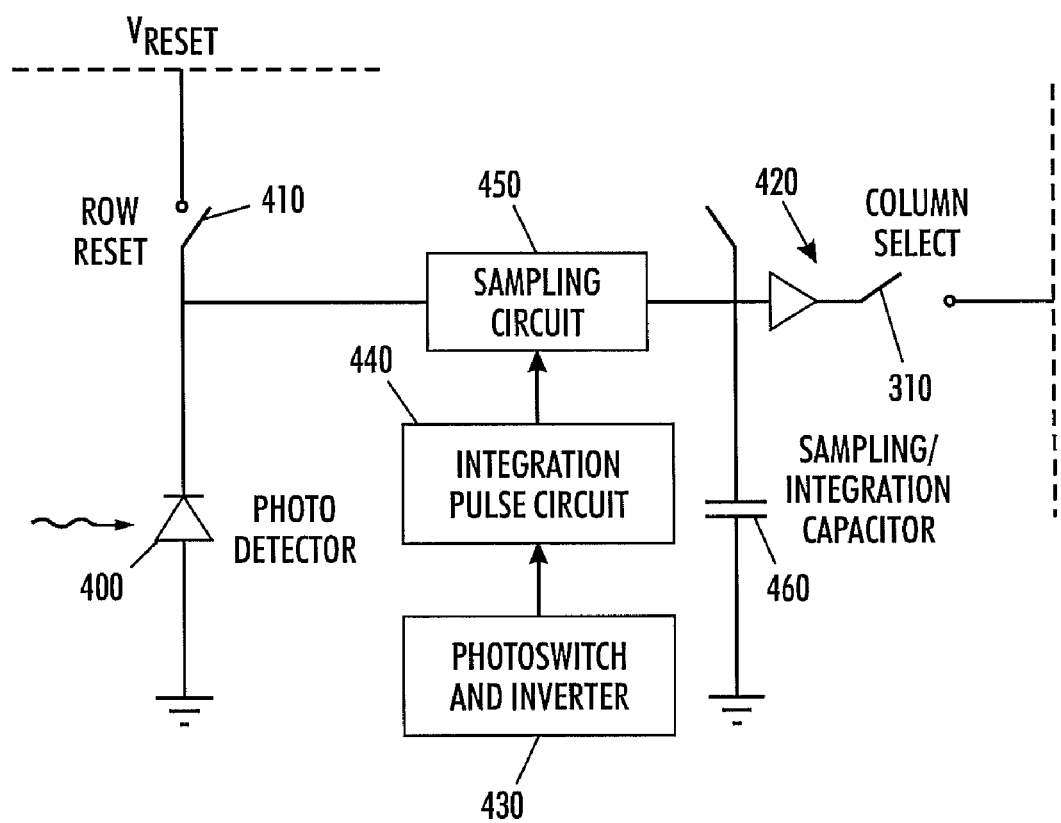
FIG. 3 illustrates a schematic of the optical distribution system illustrated in FIG. 1.

One option for providing parallel clock distribution is the optical distribution of signal exposure control for focal plane arrays. According to the concepts of the present invention, for this distribution, an optical trigger is used to start and/or control the integration period. This approach for optically distributing the trigger signal that controls the exposure will be discussed in more detail below in conjunction with the Figures. A conceptual implementation of this approach for high-speed x-ray imaging is illustrated in FIGS. 1-3.

FIG. 1 shows the architecture for the optical trigger distribution for sampling an x-ray image according to the concepts of the present invention. Moreover, FIG. 2 shows example locations of a photodetector and photoswitch being implemented using CMOS silicon on insulator (SOI) technology, and FIG. 3 provides a schematic of the pixel.

As illustrated in FIG. 1, a short, uniformly distributed optical pulse (<10 picoseconds) from a laser 100 illuminates all the detectors 200 on the side opposite where the x-ray photon signal 500 is detected by photodiodes 400. The photoelectrons produced by detecting the x-ray photon signal 500 by photodiodes 400 generates a voltage that corresponds to the intensity of the incident x-ray photon signal 500 and is sampled by some circuitry 300 that receives a trigger signal.

As shown in FIG. 1, the photoelectrons from the laser 100 discharge a photoswitch 200 that is connected to a gate of a CMOS inverter 210. It is noted that the photoswitch 200 may be a photodiode. The output of the CMOS inverter 210 is fed to in-pixel CMOS timing circuitry 300. This output form the CMOS inverter 210 controls the start of the integration period as well as perhaps multiple sampling sequences. Multiple optical pulses from laser 100 or in-pixel CMOS timing circuitry 300 can control the period length, sample number, and sample region.

As shown in FIG. 2, a photodiode 3000 is constructed to detect the x-ray photon signal. Above the photodiode 3000, a buried oxide 3500, of about 200 nm in thickness, is formed. Above the buried oxide 3500, transistors 3100 to control the operations of the photodiode 3000 and the photoswitch/ CMOS inverter 3200 are formed.

In FIG. 3, the schematic of a CMOS pixel is illustrated. This example pixel configuration employs a photodiode 400, but it is to be recognized that the pixel can include other light collecting configurations, embodied as, e.g., a phototransistor, a photogate, or other selected configuration.

As illustrated in FIG. 3, the photodiode 400 of the pixel produces a current of photo-generated electrical charge in response to light incident upon the pixel. The resulting photocurrent is directed to a charge-sensing capacitor. The charge-sensing capacitor can be a physical electrical element of a pixel that also may include the parasitic reverse-biased P-N junction capacitance and other parasitic capacitance associated with the photodiode 400.

An optical trigger is received by photoswitch/inverter 430. In response to the optical trigger, the photoswitch/inverter 430 sends a signal to integration pulse circuit 440. Integration pulse circuit 440 controls the integration of the photodiode. As noted above, multiple optical trigger pulses received by the photoswitch/inverter 430 or integration pulse circuit 440, based upon a single optical trigger pulse per integration period, can control the period length, sample number, and sample region of the integration period.

A sampling circuit 450, in response to the integration pulse circuit 440, buffers the voltage on the charge-sensing capacitor nondestructively to a sampling/integration capacitor 460. An amplifier (420)/pass transistor (310) combination acts as a source follower that enables the amplifier (420)/pass transistor (310) combination to transfer the voltage on the sampling/integration capacitor 460 to a column line for reading out the voltage. Specifically, amplifier 420 activates the pass transistor 310 when the particular row is selected, thereby enabling the sampling/integration capacitor voltage measurement.

In the example of FIG. 2, a short, uniform optical pulse (tens of picoseconds) illuminates the entire detector surface on the side opposite where the x-ray signal enters. The photoelectrons discharge a photoswitch 3200 that is connected to the gate of a CMOS inverter (part of CMOS transistor circuitry 3100). The output of the inverter provides a signal, which represents the start of the integration period to the integration pulse circuit (CMOS transistor circuitry 3100). The integration pulse circuit controls the operations of the sampling circuit. It is noted that there may be multiple outputs of the inverter representing multiple sampling sequences. As noted above, multiple optical pulses or in-pixel CMOS timing circuitry can control the period length, sample number, and sample region. In accordance with the concepts of the present invention, the optical trigger is isolated from the x-ray signal.

As shown in FIG. 2, a pixel 10 includes a photodiode 3000 for detecting, in this example, x-ray photons. The photodiode 3000 is formed on a high resistivity p-substrate 3600. Formed upon the photodiode 3000 is a buried oxide layer 3500 to isolate a photoswitch 3200 from the x-ray photodetector 3000. Also, formed upon the buried oxide layer 3500 is the CMOS transistor circuitry 3100.

It is noted that the photoswitch 3200 is formed in a CMOS silicon on insulator layer such that the photoswitch is substantially insensitive to radiation having energies above 1 keV and is substantially sensitive to radiation having a short absorption length. The CMOS silicon on insulator layer is about 50 nanometers thick. Moreover, the CMOS silicon on insulator layer may include a color filter so as to cause the photoswitch to be sensitive to light having a color corresponding to the color filter.

The embodiment of FIG. 2 uses CMOS silicon-on-insulator technology to effectively isolate the photoswitch 3200 from the x-ray photodetector 3000 so that a large-format solid-state device can be constructed, using the principles of FIG. 2, having an effective fill factor of 100% (x-ray detector active area). As noted above, the buried oxide (~200 nm in thickness) electrically insulates the photoswitch 3200 from the x-ray photodetector 3000. The photoswitch 3200 discharges it's voltage in time scales of tens of picoseconds.

In a preferred embodiment, the silicon region used to fabricate the photoswitch 3200 and CMOS transistor circuitry 3100 has a thickness of 10 nm to 50 nm. The wavelength of the optical trigger should, preferably, be chosen with an absorption length about 5× less than the silicon thickness and photon energy less than the fluorescence threshold of the silicon dioxide insulator. This thickness gives a preferred wavelength range of approximately 350 nm to 450 nm for the optical trigger.

Figure 6:
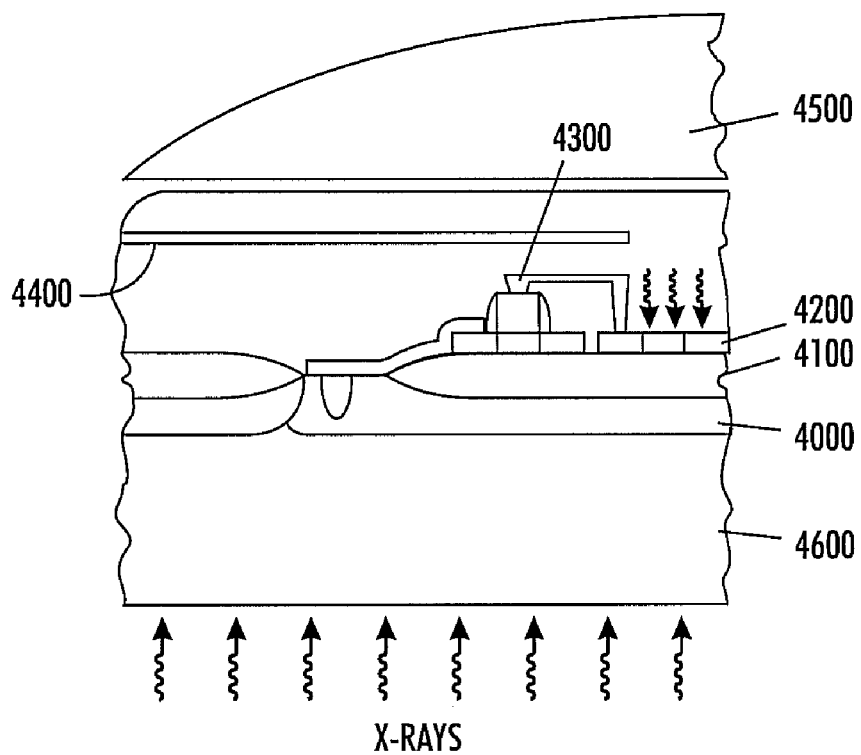
FIG. 6 illustrates another graphical representation of a pixel having a photoswitch from the detector according to the present invention.

FIG. 6 illustrates a third embodiment of the present invention wherein the photodetector is implemented using CMOS silicon on insulator (SOI) technology. As illustrated in FIG. 6, a photodiode 4000 for detecting, in this example, x-ray photons is formed on a high resistivity p-substrate 4600. Formed upon the photodiode 4000 is a buried oxide layer 4100 to isolate a photoswitch 4200 from the x-ray photodetector 4000. Also, formed upon the buried oxide layer 4100 is CMOS transistor circuitry 4300. Moreover, a microlens 4500 and light shield 4400 are included for further isolation so that the illumination can be confine to the photoswitch regions.

Figure 7:
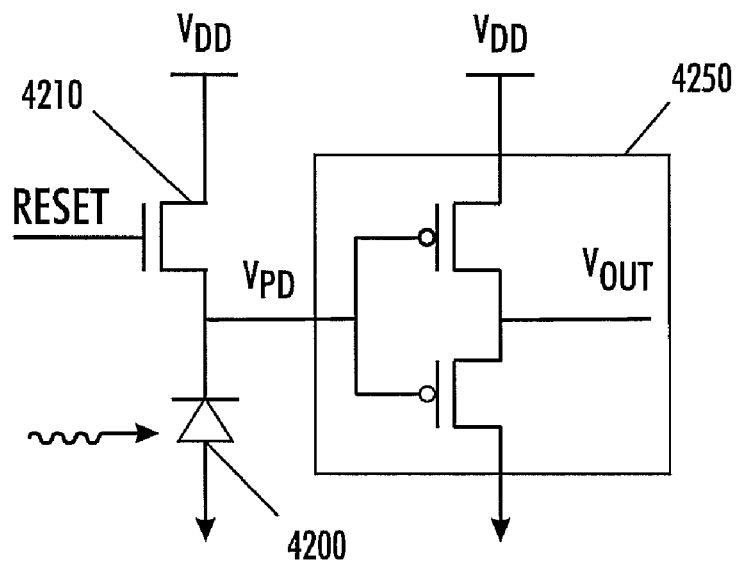
FIG. 7 illustrates a schematic implementation of a photoswitch according to the concepts of the present invention.

FIG. 7 illustrates an implementation of the photoswitch trigger. In this embodiment, the photoswitch 4200 is connected to a gate of an inverter 4250. The inverter 4250 converts the voltage read from the photoswitch 4200 to an electrical pulse that is used to control the pixel circuitry. The photoswitch 4200 is also connected to a reset transistor 4210 for periodically resetting the voltage of the photoswitch 4200.

Figure 8:
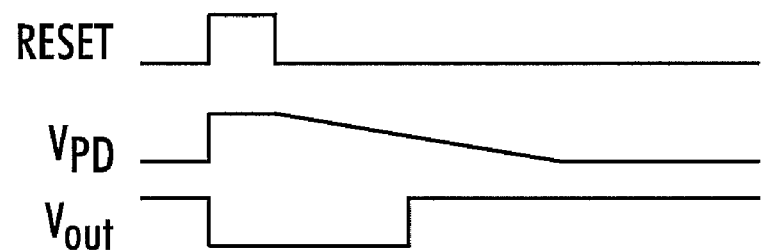
FIG. 8 illustrates a timing diagram of the operations of the photoswitch illustrated in FIG. 7.

FIG. 8 illustrates an example of the timing diagram of this embodiment. As shown in FIG. 8, a reset pulse is applied to the photoswitch 4200 to reset its voltage. The resetting of the photoswitch 4200 causes the voltage being output from the inverter 4250 to go low. As the photoswitch 4200 receives light, the charge therein dissipates and its voltage level decreases. Upon the photoswitch 4200 reaching a certain threshold voltage, the low voltage level causes the voltage being output from the inverter 4250 to toggle and go high.

It is noted that the energy per pixel needed to trigger an event depends on the photoswitch fill factor, quantum efficiency, and embedded capacitance. In a preferred embodiment of the present invention, the capacitance, that includes the photodiode, CMOS amplifier, and miscellaneous parasitic capacitance, is found to be approximately 20 femtofarads. Assuming a quantum efficiency of 50%, fill factor of 1%, and switching voltage of 3.3 volts, the energy per pixel is estimated to be approximately 40 pico-joules/pulse or 40 micro-joules/pulse for a million-pixel focal-plane array. As noted above, scattered light can be a problem, so microlenses can be integrated into the system to substantially increase the fill factor and reduce the energy.

The advantage of the optical exposure control of the present invention over conventional electrical approaches for large-format arrays (>1 cm×1 cm) is the ease in illuminating relatively large areas simultaneously with low skew and low jitter. The optical trigger is optically and electrically isolated from the x-ray photon signal for good performance. With the CMOS-SOI technology, the photoswitches are arranged such that the photoswitch trigger is isolated from the photodetector, thus resulting in an effective fill factor of 100% (x-ray detector active area).

The optical trigger solution of the present invention provides switching times of tens of picoseconds for 0.18 μm gate length transistors. In a preferred embodiment, the optical trigger signal wavelength is chosen to be between 350 nm to 450 nm so almost all the light from the trigger (laser) source is absorbed in the thin 50 nm thick silicon region. This is the same region that is used for the transistor circuitry. The short absorption lengths of the UV-blue light reduce the trigger light leakage into the x-ray photodetector region. However, it is noted that the trigger wavelengths should be longer than 350 nm so photocarriers are not generated in the silicon dioxide layers.

If a small amount of light penetrates into the x-ray photodetector region, this light will create photocarriers in the heavily doped n+ layer where the carriers will likely recombine and therefore not corrupt the x-ray photoelectron signal. As further noted above, the photoswitches of the present invention operate at tens of picoseconds. The fast response time are the result close spacing of the order of a few tenths of a micron between the n+ and p+ photoswitch regions.

The x-ray photodetectors are built in a handle wafer substrate below the buried oxide. Back-illuminated process technology such as the process developed by Lincoln Laboratory's high-quantum-efficiency CCDs, can be used to thin the substrate to thicknesses that are optimized for quantum efficiency and speed. The low x-ray absorption in the relatively thin SOI layer helps protect the transistor circuitry and photoswitches from adverse affects of x-ray generated photocharge.

The optical sampling of the present invention may be relevant for both single and multiple sampling. The multiple samples may rely on a local energy source such as a precharged capacitor. The optical sampling approach of the present invention may also provide flexible spatial sampling.

In another embodiment of the present invention for the providing a trigger with reduced skew, a tree type (H-tree or row-column) structure is utilized to distribute the clock signal electrically. An example of such an embodiment is illustrated in FIG. 4.

Figure 4:
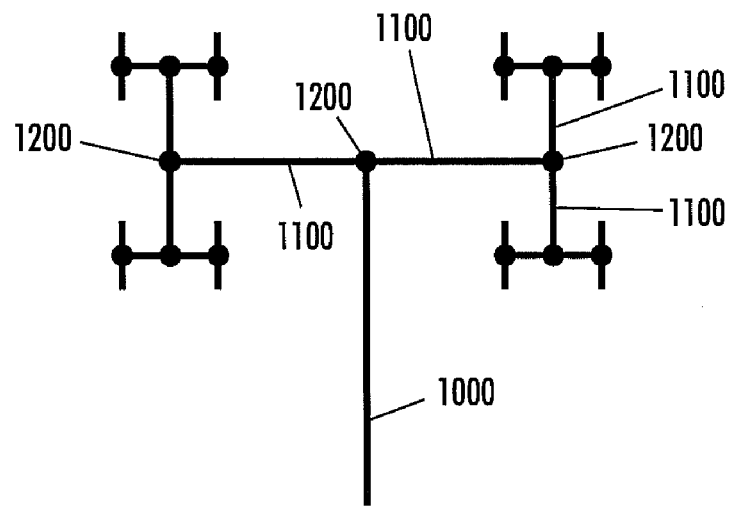
FIG. 4 illustrates a conceptual representation of an electrical distribution system for a large-format focal-plane array according to the concepts of the present invention.
Figure 5:
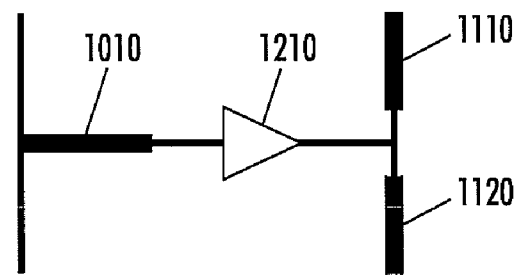
FIG. 5 illustrates a schematic of a branch point of the electrical distribution system illustrated in FIG. 4.

With respect to FIG. 4, a trigger clock driver or several parallel drivers send(s) a signal down lines 1000 that branch at branch points 1200 to form branches 1100 until the signal reaches all pixels (or an array of pixels that can be easily driven) at the last branch point 1200. As shown in FIG. 5, a branch point along the signal chain 1010 can contain a repeater buffer 1210 that sharpens the pulse edge before being sent down branch lines 1110 and 1120. Also, by locating the repeaters 1210 every few tenths of a millimeter, the short signal line length in between branches can be treated as lumped circuit elements.

For passive clock trees, the signal is attenuated within several millimeters for typical CMOS processes. To overcome the attenuation, an active buffer (repeater) is placed every few millimeters (depending on the fanout of the tree type electrical distribution structure) to sharpen the pulse edge. The active repeater adds both a fixed and random time delay jitter). It is noted that calibration techniques can be used to remove the fixed delay. The tree structure should be optimized to limit the random jitter. Even so, for relatively large chips of a few centimeters the number of repeaters needed to distribute the clock to the final array of pixels will be of the order of twenty.

If the jitter is assumed to be independent for each repeater, the standard deviation for the total jitter should be less tens of picoseconds to be useful for applications with integration times of this order.

Figure 10:
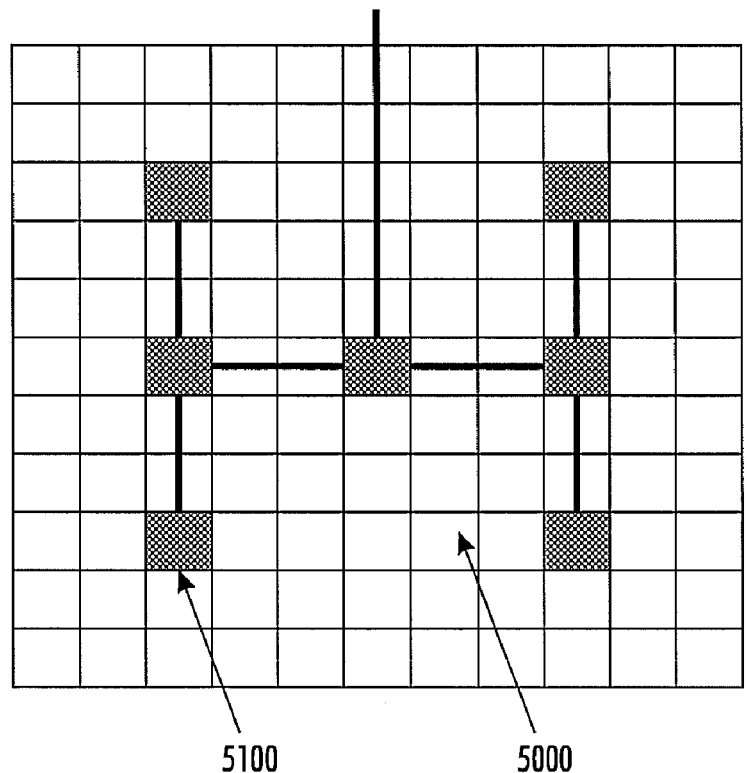
FIG. 10 illustrates a graphical representation of an imager array layout using an electrical distribution system.

The active repeaters can occupy space in the pixel array that would otherwise be used for light sensing pixels. FIG. 10 shows a possible arrangement for the clock distribution and active repeaters illustrating this effect. FIG. 10 shows a pixel array of a plurality of active pixels sites 5000 and a plurality of inactive pixel sites 5100 which contain the active repeaters. It is noted that the clock tree may end at a single pixel location or an array of pixels depending on drive requirements (line lengths, transistor capacitive loading, etc.).

Figure 11:
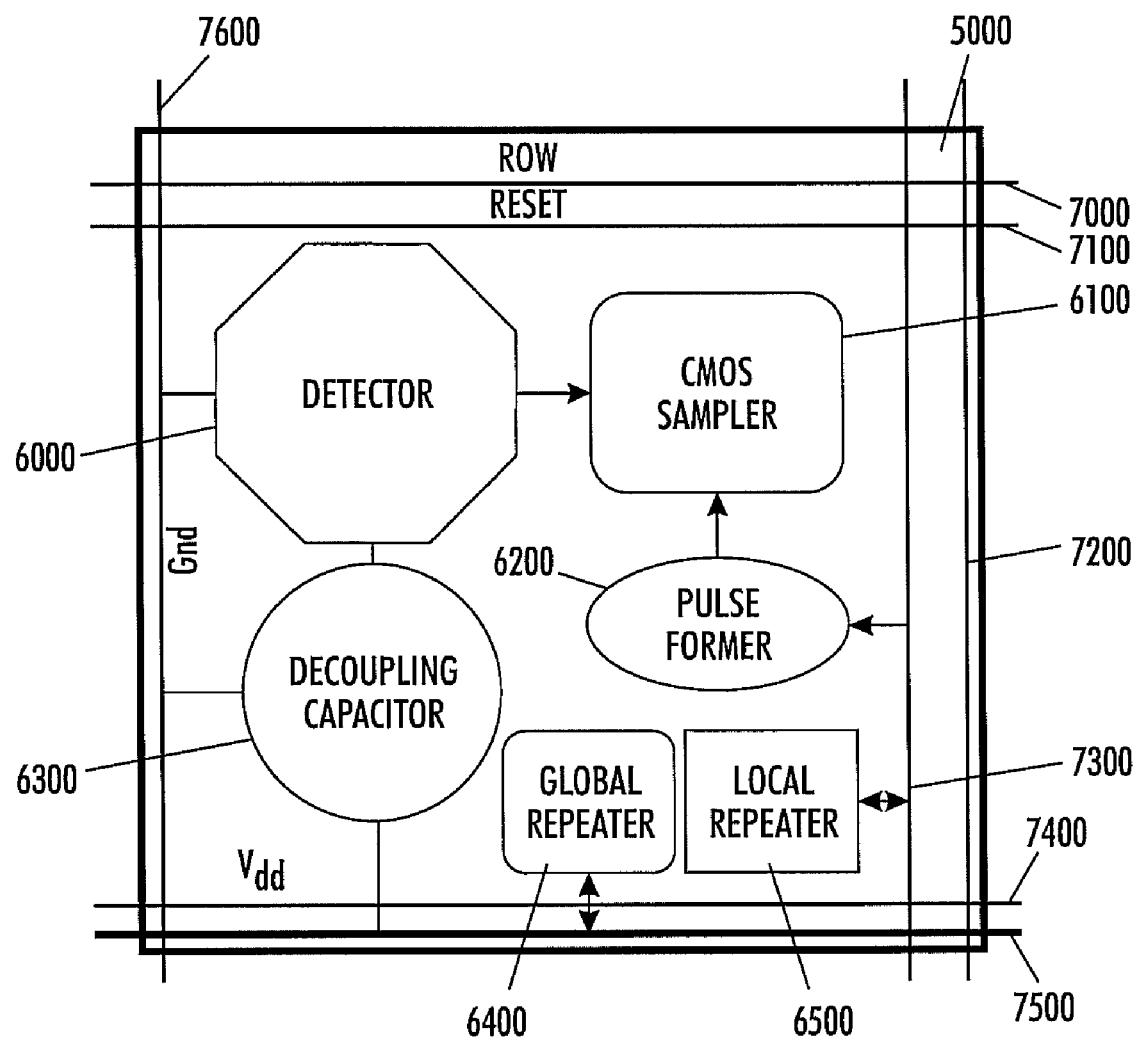
FIG. 11 illustrates a graphical representation of a pixel's architecture utilizing the electrical distribution system according to the concepts of the present invention.

To avoid dead pixels 5100, the active repeater can be created from circuitry residing in every pixel. One or perhaps several pixels would be used to create the active repeater at the branch point depending on the drive requirements. FIG. 11 shows the composition of the pixel with circuitry for the global and local distribution of the clock as well as the photodetector, sampling circuit and decoupling capacitors.

As illustrated in FIG. 11, the pixel site 5000 may include a global repeater 6400 for repeating the signal onto other pixel regions of the imager. The global repeater 6400 is usually located at a branch in the clock distribution system. A local repeater 6500 may also be included for repeating the signal onto other locally adjacent pixels of the imager. The local repeater 6500 is usually located at an end point in the clock distribution system if the end point is use to trigger a small region of adjacent pixels.

The pixel site 5000 also includes a photodiode or detection area 6000 to detect an amount light incident thereupon. The detector 6000 is connected to CMOS sampling circuitry 6100 to provide a signal corresponding to the amount of incident light detected during an integration period. A pulse forming circuit 6200 is also included to receive the local signal produced by a local repeater and produce the needed control signals for the CMOS sampling circuitry 6100. A decoupling capacitor 6300 is also included. Lastly, various lines (global shutter bus 7500, local shutter bus 7300, column line 7200, row select line 7000, reset line 7100, ground 7600, and $V_{DD}$ line 7400) are formed around the pixel site 5000.

In this distribution structure, the pixels can be designed such that there are several versions of pixel architectures with different circuitry that are distributed according to the desired function needed at different locations in the array.

The exposure time is set by the time between the rising and falling edge of the clock. In one embodiment of the clock implementation of the present invention, only the falling (rising) edge of the clock is transferred through the clock tree with rising (falling) edge being generated locally to give the pulse that determines the integration time in the array of pixels at the end point of the clock tree. The in-pixel circuitry is used to create the falling edge as well as the pulse width to set the integration time.

Figure 9:
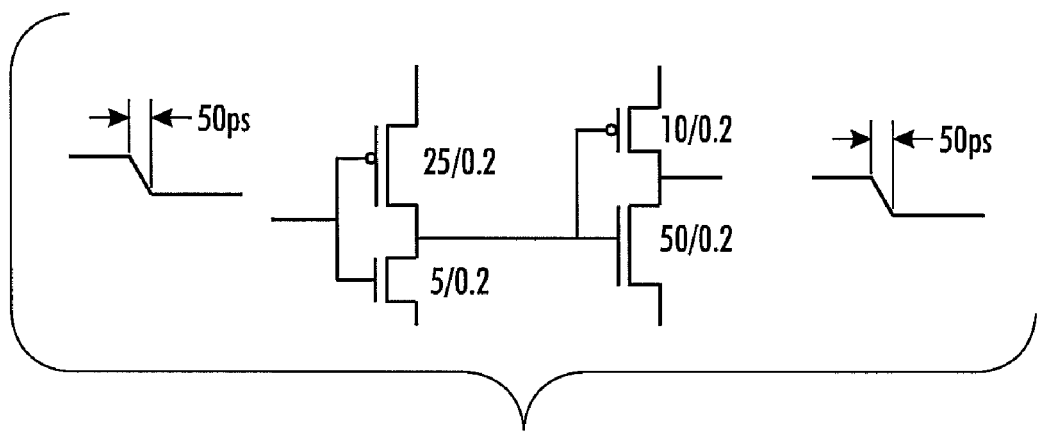
FIG. 9 illustrates a schematic of an unbalanced buffer according to the concepts of the present invention.

Distributing just the falling (rising) edge allows use of an unbalanced inverter as illustrated in FIG. 9 that is optimized for generating a fast falling (rising) edge as opposed to a symmetric inverter that generates both fast rising and falling edges. Transferring both edges can compromise speed and/or area. The unbalanced inverter of FIG. 9 shows an unbalanced inverter with asymmetric n-channel and p-channel transistors.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A large format imager, comprising:
   an array of pixels for converting electromagnetic radiation into electrical signals; and
   trigger means for accepting an optical pulse so as to trigger the pixels to generate an integration period;
   said pixels each including, a photodiode to convert light intensity of high-frequency radiation into an electrical charge, a reset switch to reset said photodiode, a select switch to enable sampling of the electrical charge produced by said photodiode, a photoswitch to convert an optical trigger pulse, received from said trigger means, into an electrical signal, an inverter, operatively connected to said photoswitch, to produce a control signal corresponding to the electrical signal produced by said photoswitch, and control circuitry, in response to said control signal, to locally generate integration control signals, said integration control signals controlling a start of an integration period for said photodiode, a duration of the integration period for said photodiode, and the sampling of the electrical charge produced by said photodiode.

2. The large format imager as claimed in claim 1, wherein said trigger means accepts multiple light pulses such that each photoswitch receives multiple light pulses within a predetermined period of time, said multiple light pulses providing information to control a period length of the integration period of the associated pixel.

3. The large format imager as claimed in claim 1, wherein said trigger means accepts multiple light pulses such that each photoswitch receives multiple light pulses within a predetermined period of time, said multiple light pulses providing information to control a sample number of the associated pixel.

4. The large format imager as claimed in claim 1, wherein said trigger means accepts multiple directional light pulses to be illuminated upon a predetermined number of photoswitches to sample the associated pixels in a predetermined subregion of the array of pixels.

5. The large format imager as claimed in claim 1, further comprising a light shield to prevent said optical pulse from being incident upon said photodiode.

6. The large format imager as claimed in claim 1, further comprising a microlens to focus said optical pulse upon said photoswitch.

7. The large format imager as claimed in claim 1, further comprising:
   a light shield to prevent said optical pulse from being incident upon said photodiode; and
   a microlens to focus said optical pulse upon said photoswitch.

8. The large format imager as claimed in claim 1, wherein the high frequency radiation is x-ray radiation.

9. A large format imager, comprising:
   an array of pixels for converting electromagnetic radiation into electrical signals; and
   trigger means for accepting an optical pulse so as to trigger the pixels to generate an integration period;
   a plurality of photoswitches, each photoswitch being operatively associated with a subset of the plurality of pixels; and
   an electrical signal distribution tree associated with each photoswitch and operatively connected to said subset of the plurality of pixels associated with said photoswitch;
   said photoswitches, upon being illuminated by said trigger means, producing an electrical exposure control signal that is propagated through said electrical signal distribution tree to each of the pixels in the subset of the plurality of pixels;
   said pixels each including, a photodiode to convert light intensity of high-frequency radiation into an electrical charge, a reset switch to reset said photodiode, a select switch to enable sampling of the electrical charge produced by said photodiode, and control circuitry, in response to said electrical exposure control signal, to locally generate integration control signals, said integration control signals controlling a start of an integration period for said photodiode, a duration of the integration period for said photodiode, and the sampling of the electrical charge produced by said photodiode.

10. The large format imager as claimed in claim 9, wherein said trigger means accepts multiple light pulses such that each photoswitch receives multiple light pulses within a predetermined period of time, said multiple light pulses providing information to control a period length of the integration period of the associated pixel.

11. The large format imager as claimed in claim 9, wherein said trigger means accepts multiple light pulses such that each photoswitch receives multiple light pulses within a predetermined period of time, said multiple light pulses providing information to control a sample number of the associated pixel.

12. The large format imager as claimed in claim 9, wherein said trigger means accepts multiple directional light pulses to be illuminated upon a predetermined number of photoswitches to sample the associated pixels in a predetermined subregion of the array of pixels.

13. The large format imager as claimed in claim 9, further comprising a light shield to prevent said optical pulse from being incident upon said photodiode.

14. The large format imager as claimed in claim 9, further comprising a microlens to focus said optical pulse upon said photoswitch.

15. The large format imager as claimed in claim 9, further comprising:
   a light shield to prevent said optical pulse from being incident upon said photodiode; and
   a microlens to focus said optical pulse upon said photoswitch.

16. The large format imager as claimed in 9, wherein the high frequency radiation is x-ray radiation.

17. A pixel site, comprising:
   a photodiode to convert light intensity of high-frequency radiation into an electrical charge;
   a reset switch to reset said photodiode;
   a select switch to enable sampling of the electrical charge produced by said photodiode;
   a photoswitch to convert an optical trigger pulse into an electrical signal;
   an inverter, operatively connected to said photoswitch, to produce a control signal corresponding to the electrical signal produced by said photoswitch; and
   control circuitry, in response to said control signal, to locally generate integration control signals, said integration control signals controlling a start of an integration period for said photodiode, a duration of the integration period for said photodiode, and the sampling of the electrical charge produced by said photodiode.

18. A pixel region, comprising:
   a plurality of pixels;
   a photoswitch being operatively associated with said plurality of pixels; and
   an electrical signal distribution tree operatively connected to said plurality of pixels and said photoswitch;

said photoswitch, upon being illuminated, producing an electrical exposure control signal that is propagated through said electrical signal distribution tree to each of the plurality of pixels;

said pixels each including,
- a photodiode to convert light intensity of high-frequency radiation into an electrical charge,
- a reset switch to reset said photodiode,
- a select switch to enable sampling of the electrical charge produced by said photodiode, and
- control circuitry, in response to said electrical exposure control signal, to locally generate integration control signals, said integration control signals controlling a start of an integration period for said photodiode, a duration of the integration period for said photodiode, and the sampling of the electrical charge produced by said photodiode.

19. A large format imager, comprising:

a plurality of pixels for converting electromagnetic radiation into electrical signals;

trigger means for producing an electrical pulse so as to trigger the pixels to generate an integration period; and a tree type electrical distribution system for propagating said electrical pulse to all said pixels;

wherein a pixel includes,
- a photodiode to convert light intensity of high-frequency radiation into an electrical charge,
- a global repeater circuit to propagate a first edge of said electrical pulse along said tree type electrical distribution system,
- a local repeater circuit to provide a local array of pixels located at an termination point of said tree type electrical distribution system with said first edge, and
- control circuitry, operatively connected to said local repeater circuit and responsive to said first edge of said electrical pulse, to locally generate integration control signals, said integration control signals controlling a start of an integration period for said photodiode, a duration of the integration period for said photodiode, and the sampling of the electrical charge produced by said photodiode.

20. The large format imager as claimed in claim 19, wherein the high frequency radiation is x-ray radiation.

21. The large format imager as claimed in claim 19, wherein said tree type electrical distribution system is a row/column tree type structure.

22. The large format imager as claimed in claim 19, wherein said tree type electrical distribution system is a H-tree type structure.

* * * * *